(12) United States Patent
Anderson et al.

(10) Patent No.: US 9,978,895 B2
(45) Date of Patent: May 22, 2018

(54) FLEXIBLE PACKAGING FOR MICROELECTRONIC DEVICES

(71) Applicant: National Technology & Engineering Solutions of Sandia, LLC, Albuquerque, NM (US)

(72) Inventors: Benjamin John Anderson, Albuquerque, NM (US); Gregory N. Nielson, Albuquerque, NM (US); Jose Luis Cruz-Campa, Albuquerque, NM (US); Murat Okandan, Edgewood, NM (US); Anthony L. Lentine, Albuquerque, NM (US); Paul J. Resnick, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 271 days.

(21) Appl. No.: 14/068,189

(22) Filed: Oct. 31, 2013

(65) Prior Publication Data
US 2015/0114451 A1 Apr. 30, 2015

(51) Int. Cl.
*H01L 31/0203* (2014.01)
*H01L 31/048* (2014.01)
(Continued)

(52) U.S. Cl.
CPC .......... *H01L 31/048* (2013.01); *H01L 31/049* (2014.12); *H01L 31/1892* (2013.01); *Y02E 10/50* (2013.01)

(58) Field of Classification Search
CPC .. H01L 31/0203; H01L 31/048; H01L 31/186
See application file for complete search history.

(56) References Cited

U.S. PATENT DOCUMENTS 3,375,141 A 3/1968 Julius
4,089,705 A 5/1978 Rubin
(Continued)

OTHER PUBLICATIONS

Baca et al., "Compact monocrystalline silicon solar modules with high voltage outputs and mechanically flexible designs." Energy Environ. Sci., 2010, vol. 3, pp. 208-211. Published on the web Jan. 11, 2010.
(Continued)

*Primary Examiner* — Golam Mowla
(74) *Attorney, Agent, or Firm* — Blakely Sokoloff Taylor Zafman LLP; Martin I. Finston

(57) ABSTRACT

An apparatus, method, and system, the apparatus and system including a flexible microsystems enabled microelectronic device package including a microelectronic device positioned on a substrate; an encapsulation layer encapsulating the microelectronic device and the substrate; a protective layer positioned around the encapsulating layer; and a reinforcing layer coupled to the protective layer, wherein the substrate, encapsulation layer, protective layer and reinforcing layer form a flexible and optically transparent package around the microelectronic device. The method including encapsulating a microelectronic device positioned on a substrate within an encapsulation layer; sealing the encapsulated microelectronic device within a protective layer; and coupling the protective layer to a reinforcing layer, wherein the substrate, encapsulation layer, protective layer and reinforcing layer form a flexible and optically transparent package around the microelectronic device.

20 Claims, 5 Drawing Sheets

(51) Int. Cl.
*H01L 31/18* (2006.01)
*H01L 31/049* (2014.01)

(56) References Cited

U.S. PATENT DOCUMENTS

| | | | |
|---|---|---|---|
| 4,149,665 A | | 4/1979 | Frosch et al. |
| 5,244,509 A | * | 9/1993 | Arao .................. H01L 31/0236 136/246 |
| 5,296,043 A | * | 3/1994 | Kawakami ...... H01L 31/022425 136/244 |
| 5,578,141 A | * | 11/1996 | Mori ................. B32B 17/10788 136/251 |
| 5,882,435 A | | 3/1999 | Holdermann |
| 5,981,864 A | * | 11/1999 | Mizutani ........... H01L 31/03921 136/244 |
| 6,018,123 A | * | 1/2000 | Takada et al. ................. 136/248 |
| 6,121,542 A | * | 9/2000 | Shiotsuka et al. ............ 136/256 |
| 6,313,395 B1 | | 11/2001 | Crane et al. |
| 6,340,403 B1 | | 1/2002 | Carey et al. |
| 6,500,731 B1 | | 12/2002 | Nakagawa et al. |
| 6,700,631 B1 | | 3/2004 | Inoue et al. |
| 6,906,253 B2 | | 6/2005 | Bauman et al. |
| 7,244,326 B2 | | 7/2007 | Craig et al. |
| 7,829,783 B2 | * | 11/2010 | Krajewski et al. ........... 136/251 |
| 7,960,643 B2 | * | 6/2011 | Krajewski ............. H01L 31/048 136/244 |
| 2001/0011552 A1 | * | 8/2001 | Morizane ......... B32B 17/10018 136/246 |
| 2007/0056626 A1 | * | 3/2007 | Funcell ............ H01L 31/02008 136/246 |
| 2009/0032087 A1 | | 2/2009 | Kalejs |
| 2010/0101627 A1 | | 4/2010 | Patel |
| 2010/0206352 A1 | | 8/2010 | Gee et al. |
| 2010/0218805 A1 | | 9/2010 | Everett et al. |
| 2010/0233838 A1 | | 9/2010 | Varghese |
| 2011/0162694 A1 | | 7/2011 | Kalmbach et al. |
| 2011/0240085 A1 | * | 10/2011 | Sasaki .................. H01G 9/2022 136/244 |
| 2012/0115262 A1 | | 5/2012 | Menard et al. |
| 2012/0142139 A1 | | 6/2012 | Varghese |
| 2013/0229080 A1 | | 9/2013 | Chen et al. |

OTHER PUBLICATIONS

Cruz-Campa, J. L., et al., "Microsystems enabled photovoltaics: 14.9% efficient 14 μm thick crystalline silicon solar cell", Solar Energy Materials & Solar Cells, 95, (2011), 551-558.
Cruz-Campa, J. L., et al., "Ultrathin flexible crystalline silicon: microsystems enabled photovoltaics", IEEE Journal of Photovoltaics, (2011), 6 pages.
Franklin, E., et al., "Sliver Solar Cells", Proc. of SPIE, vol. 6800, (2008), 11 pages.
Franklin, E., et al., "Sliver solar cells: High-efficiency, low-cost PV technology", OptoElectronics, vol. 2007, (2007), 9 pages.
Gupta, V., et al., "Microsystems-Enabled Photovoltaics: A path to the widespread harnessing of solar energy", Future Photovoltaics, 1, (May 2010), 28-36.
Nielson, G. N., et al., "Microscale C—Si (C)PV Cells for low-cost power", 34th IEEE PVSC, (2009), 1816-1821.
Nielson, G. N., et al., "Microscale PV Cells for Concentrated PV Applications", 24th EU PVSEC, (2009), 170-173.
Yoon, J., et al., "Ultrathin silicon solar microcells for semitransparent, mechanically flexible and microconcentrator module designs", Nature Materials, 7, (2008), 907-915.
English translation of JP11-068133; Matsushita et al. Sep. 3, 1999.

\* cited by examiner

FLEXIBLE PACKAGING FOR MICROELECTRONIC DEVICES

GOVERNMENT RIGHTS

This invention was developed under Contract DE-AC04-94AL85000 between Sandia Corporation and the U.S. Department of Energy. The U.S. Government has certain rights in this invention.

FIELD OF THE INVENTION

The present invention relates in general to flexible packaging for electronic devices, in particular, flexible packaging for microelectronic devices such as photovoltaic cells. Other embodiments are also described and claimed.

BACKGROUND

Photovoltaic solar cells have the potential to provide power well beyond the needs of the power grid and other fixed facility power needs. There is a need for power in remote locations where it is not feasible to transport batteries or fuel for generators such as in space or in remote terrestrial areas where there is not a power grid and there is not access to fuel.

For photovoltaic solar cells to be useful for many of these remote power applications requires performance characteristics that are not provided by the rigid rectangular modules used for residential, commercial, and utility scale solar power installations. The performance characteristics required for remote power applications include low mass per area or (more specifically) a high power output per unit of mass, high efficiency, the ability to tightly pack or roll the photovoltaic module into a small volume for enhanced portability (provided by creating a solar module that is highly flexible), and ruggedness to rough treatment that may occur during transport.

One method to provide a system with these characteristics is to reduce the size of solar cells to allow unique behaviors that are enhanced with very small cells. In this aspect, small and thin photovoltaic cells have been developed. These cells can be formed and then assembled by various means onto a receiving substrate providing electrical interconnects. The receiving substrate with the cells can then be packaged to provide a module with the desirable characteristics for providing remote power.

SUMMARY

An apparatus, system and method for forming a flexible packaging for electronic devices, for example, microelectronic devices such as photovoltaic solar cells. The packaging is designed to completely encapsulate the electronic devices and provide mechanical robustness, moisture resistance and a high degree of flexibility to the assembly of electronic devices.

In one embodiment, the apparatus includes a flexible microsystems enabled microelectronic device package including a microelectronic device positioned on a substrate. The apparatus further includes an encapsulation layer encapsulating the microelectronic device and the substrate. A protective layer may be positioned around the encapsulating layer and a reinforcing layer may be coupled to the protective layer. The substrate, encapsulation layer, protective layer and reinforcing layer may form a flexible and optically transparent package around the microelectronic device.

In one embodiment, the method may include encapsulating a microelectronic device positioned on a substrate within an encapsulation layer. The encapsulated microelectronic device may then be sealed within a protective layer and coupled to a reinforcing layer. The substrate, encapsulation layer, protective layer and reinforcing layer may form a flexible and optically transparent package around the microelectronic device.

In one embodiment, the system may include a microelectronic device module comprising a plurality of photovoltaic cells electrically coupled to a substrate. An optically transparent and moisture resistant encapsulation module may encapsulate the plurality of photovoltaic cells and the substrate. A reinforcing layer may be coupled to the encapsulation module. The reinforcing layer and the encapsulation module may form a flexible package around the plurality of photovoltaic cells.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The invention may best be understood by referring to the following description and accompanying drawings that are used to illustrate embodiments of the invention. In the drawings.

DETAILED DESCRIPTION

Figure 1:
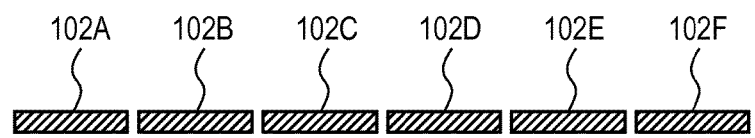
FIG. 1 schematically illustrates a cross-sectional side view of one embodiment of a plurality of microelectronic devices.

FIG. 1 schematically illustrates a cross-sectional side view of one embodiment of a plurality of microelectronic devices. Representatively, in one embodiment, the microelectronic devices 102A-102F may be microsystems enabled photovoltaic (MEPV) cells. It should be understood that the terms "photovoltaic solar cell", "photovoltaic cell", "solar cell" and "cell" may be used interchangeably herein to refer to any of microelectronic devices 102A-102F. In addition, it should be understood that although microelectronic devices 102A-102F are described as solar cells herein, they may be any type of microscale component or macroscale component that could benefit from any of the flexible packaging embodiments disclosed herein. Representatively, microelectronic devices 102A-102F could be light emitting diode devices, integrated circuit devices, or other semiconductor devices or the like. In addition, the term "flexible" as used herein should be understood as referring to the ability of any package, module, assembly, layer or material described herein of being bent and returning to its original non-bent configuration without breaking. For example, the package, module, assembly, layer or material described herein may be considered "flexible" where it has a bend radius of from about 0.75 mm to about 1 cm, for example, from about 2 mm to about 8 mm, or from about 3 mm to about 5 mm and can be returned to a non-bent configuration relatively easily.

Microelectronic devices 102A-102F may be, in some embodiments, as small as 10 micrometers across and 1 micrometer thick to 100s of micrometers across and 40-50 micrometers thick devices which may be fabricated on a wafer according to any standard microprocessing techniques. Once fabricated, microelectronic devices 102A-102F may be separated from the wafer by, for example, a chemical or mechanical separating technique (e.g. application of an HF solution which chemically separates the devices from the wafer). For example, the devices may be individually detached from the wafer by, for example, an etching process using a hydrofluoric acid (HF) solution to undercut the cells. These "free floating" cells may then be assembled into sheets by attracting the individual cells to a desired position on a substrate using self-assembly techniques.

Figure 2:
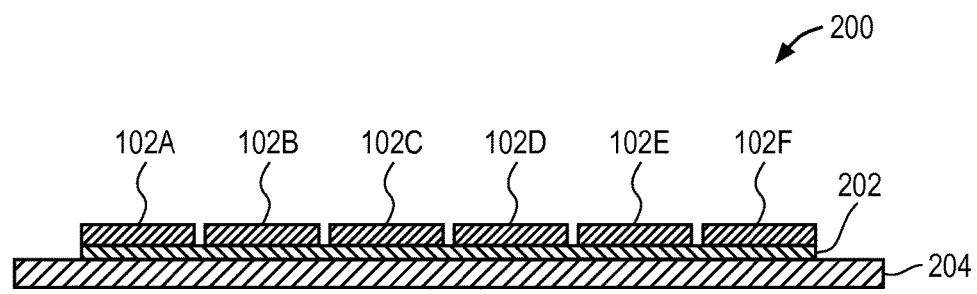
FIG. 2 schematically illustrates a cross-sectional side view of the microelectronic devices of FIG. 1 assembled on a flexible substrate layer.

FIG. 2 schematically illustrates a cross-sectional side view of the microelectronic devices of FIG. 1 assembled on a flexible substrate. To form the flexible packaging disclosed herein, microelectronic devices 102A-102F are connected to a substrate 204 to form microelectronic device module 200. Substrate 204 may be, in some embodiments, a flexible substrate having circuitry or wiring formed therein. In such embodiments, metal interconnections may be formed between substrate 204 and microelectronic device 102A-102F such that microelectronic devices 102A-102F may be electrically connected to substrate 204 and other assemblies within which they may be integrated (e.g. a concentrated photovoltaic module). Substrate 204 may be made of any material capable of forming a flexible substrate. Representative materials may include plastic polymeric materials, including, but not limited to polyimide, polyethersulfone, polyether ether ketone (PEEK) or a transparent conductive polyester film.

Microelectronic devices 102A-102F may be bonded to substrate 204. In some embodiments, microelectronic devices 102A-102F are bonded to substrate 204 with an adhesive layer 202. Adhesive layer 202 may, in some embodiments, be made of an adhesive material such that bonding is achieved by adhering microelectronic devices 102A-102F to substrate 204. A representative adhesive material may be a high temperature adhesive such as cyanate ester. In such embodiments, the cyanate ester adhesive is applied to substrate 204 followed by placement of microelectronic devices 102A-102F on top of the adhesive. Once in position, the assembly is heated to a high temperature to cure the adhesive. In other embodiments, adhesive layer 202 may be formed by any type of bonding material, for example, solder bumps which can be deposited on substrate 204 at locations where a connection to microelectronic devices 102A-102F is desired and then heated to bond devices 102A-102F to substrate 204. Alternatively, adhesive layer 202 may be made of an epoxy, bismalimide, or bismalimide-triazine material. In any case, it is important that any material used for adhesive layer 202 be a material which is compatible with microelectronic devices 102A-102F and any electrical connections (e.g. metal interconnections or wiring) formed between microelectronic devices 102A-102F and substrate 204. It is also important that a material for adhesive layer 202 not substantially impact or reduce a flexibility of the packaging.

Figure 3:
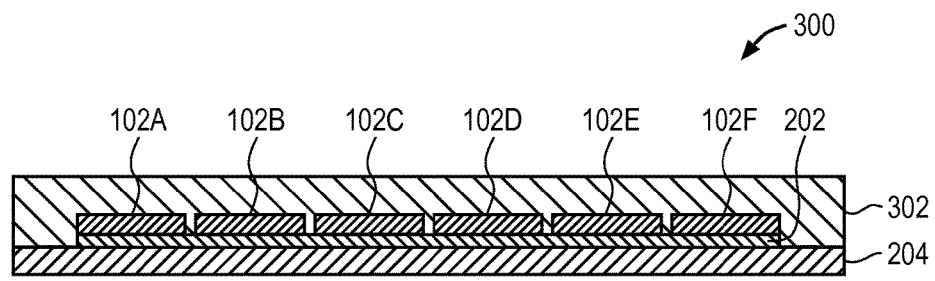
FIG. 3 schematically illustrates a cross-sectional side view of an encapsulation layer formed over the assembly of FIG. 2.

FIG. 3 schematically illustrates a cross-sectional side view of an encapsulation layer formed over the assembly of FIG. 2. Once microelectronic device module 200 is formed, it is encapsulated within encapsulation layer 302 to form an encapsulated or encapsulation module 300. In some embodiments, for example where microelectronic devices 102A-102F are PV cells, encapsulation layer 302 may be optically transparent such that light waves can be transmitted to the PV cells through encapsulation layer 302. Representatively, in one embodiment, encapsulation layer 302 is any optically transparent material, which is also flexible so that it does not significantly impact a flexibility of the packaging. In some embodiments, encapsulation layer 302 may be made of an elastomeric material capable of accepting large strain. Representative materials may include, but are not limited to, silicone materials such as polydimethylsiloxane (PDMS) as well as other materials such as ethylene vinyl acetate (EVA), polyurethane, and polyolefin. Other suitable materials, depending upon the type of devices encapsulated within encapsulation layer 302, may include fire retardant materials, fire retardant treated materials and waterproof materials, including but not limited to, polyesters, nylon, acrylic and other commercial brands such as Marko®, Marlan® and Nomex®.

Depending upon the material selected for encapsulation layer 302, encapsulation layer 302 may be formed by a spin coating, doctor blading or a lamination technique. For example, in the case of a silicone encapsulation layer, encapsulation layer 302 may be formed by spin coating the material over microelectronic devices 102A-102F such that it covers all exposed surfaces of microelectronic devices 102A-102F and allowing it to cure. Alternatively, encapsulation layer 302 may be formed by a film of material which can be thermally laminated around microelectronic devices 102A-102F. In some embodiments, encapsulation layer 302 may have a thickness of less than 60 micrometers, for example, 50 micrometers or less, or from about 25 micrometers to about 50 micrometers. In addition to providing a protective transparent layer through which light can be transmitted to microelectronic devices 102A-102F, encapsulation layer 302 may also facilitate bonding of devices 102A-102F to substrate 204 since it can encapsulate each of devices 102A-102F and any exposed surfaces of substrate 204.

Figure 4:
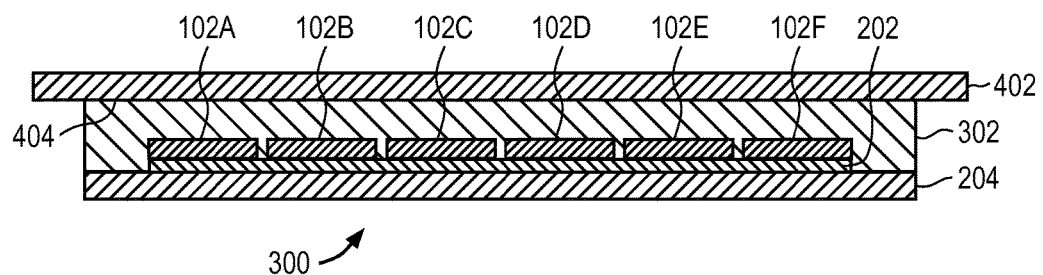
FIG. 4 schematically illustrates a cross-sectional side view of a protective layer formed over the assembly of FIG. 3.

FIG. 4 schematically illustrates a cross-sectional side view of a protective layer formed over the assembly of FIG. 3. Once encapsulation layer 302 is formed, the resulting encapsulated module 300 is covered by a protective layer 402 according to the process shown in FIG. 4-FIG. 7. Representatively, in one embodiment, protective layer 402 is applied over an exposed top face 404 (side covering devices 102A-102F) of encapsulation layer 302 and bonded to encapsulation layer 302. For example, in one embodiment, protective layer 402 may be formed by surface treating the protective layer 402 and applying it to encapsulation layer 302 before encapsulation layer 302 is cured, encapsulation layer 302 is then cured such that the two layers bond together. In other embodiments, protective layer 402 is made of a material that can be spin coated onto protective layer 402 and bonded thereto prior to or after curing of encapsulation layer 302. Suitable materials for protective layer may include any substantially flexible materials capable of forming a moisture resistant seal around encapsulation module 300. In addition, suitable materials may be any material, particularly in cases where devices 102A-102F are PV cells, which is optically transparent and can provide mechanical protection to devices 102A-102F. Representative materials may include, but are not limited to, polychlorotrifluoroethylene (PCTFE), polytetrafluoroethylene (PTFE), ethylene chlorotrifluoroethylene (ECTFE), ethylene tetrafluoroethylene (ETFE) or polyvinylidene difluoride (PVDF). In some embodiments, protective layer 402 may have a thickness of less than 60 micrometers, for example, 50 micrometers or less, or from about 25 micrometers to about 50 micrometers.

Figure 5:
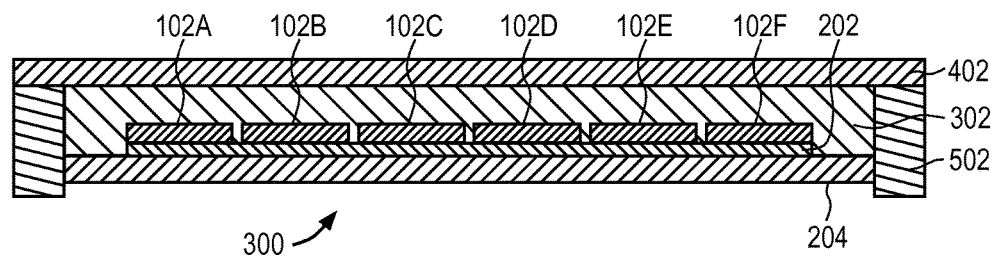
FIG. 5 schematically illustrates a cross-sectional side view of a perimeter protective layer formed around the assembly of FIG. 4.

FIG. 5 schematically illustrates a cross-sectional side view of a perimeter protective layer formed around the assembly of FIG. 4. Perimeter protective layer 502 may be formed around a perimeter of encapsulation module 300, which remains exposed after application of protective layer 402. In some embodiments, perimeter protective layer 502 may be formed from a film which has a cut out center dimensioned to fit around encapsulation module 300. In this aspect, once the film opening is formed, perimeter protective layer 502 may be positioned around encapsulation module 300 and sealed against protective layer 402 by, for example, an ultrasonic welding or thermal welding process. In other embodiments, perimeter protective layer 502 may be a sealant tape or sealant bead applied around the exposed perimeter of encapsulation module 300 and sealed to protective layer 402.

Perimeter protective layer 502 may be made of the same material as protective layer 402. Representatively, perimeter protective layer 502 may be made of any material capable of forming a moisture resistant seal around encapsulation module 300. Representative materials may include, but are not limited to, polychlorotrifluoroethylene (PCTFE), polytetrafluoroethylene (PTFE), ethylene chlorotrifluoroethylene (ECTFE), ethylene tetrafluoroethylene (ETFE) or polyvinylidene difluoride (PVDF).

Figure 6:
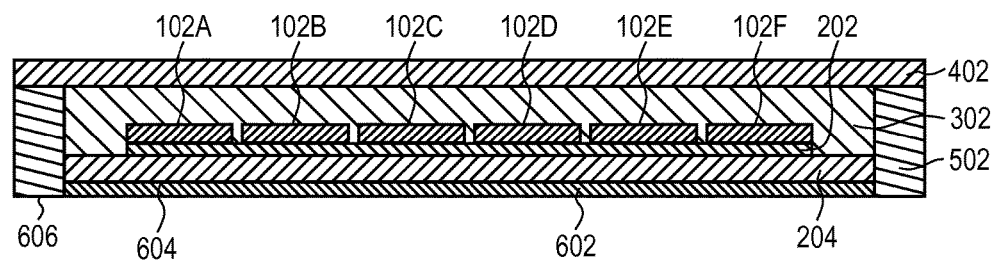
FIG. 6 schematically illustrates a cross-sectional side view of an adhesive layer formed on the assembly of FIG. 5.
Figure 7:
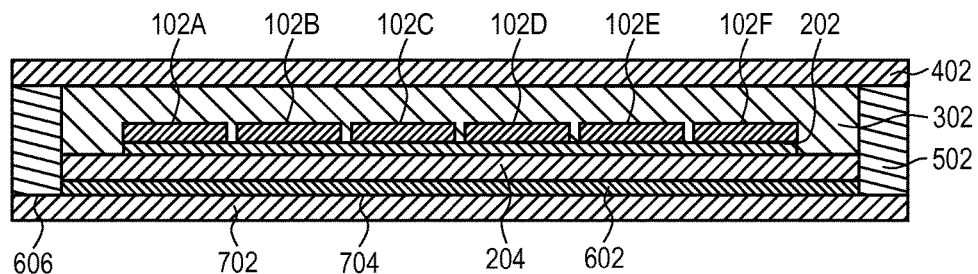
FIG. 7 schematically illustrates a cross-sectional side view of a further protective layer formed on the adhesive layer of the assembly of FIG. 6.

FIG. 6 schematically illustrates a cross-sectional side view of a further adhesive layer formed on the assembly of FIG. 5. Adhesive layer 602 may be applied to substrate 204 to facilitate attachment of a final protective layer 702 along a bottom side 604 of encapsulation module 300 and a bottom side 606 of perimeter protective layer 502, as shown in FIG. 7. In this aspect, although adhesive layer 602 is shown formed along the bottom side 604 of substrate 204, it may instead or additionally, be formed along a top side 704 of the final protective layer 702 as shown in FIG. 7. Adhesive layer 602 may be formed by any material capable of bonding substrate 204 to another protective layer 702. In preferred embodiments, the material for adhesive layer 602 is an elastomeric material having adhesive properties. Representatively, in some embodiments, adhesive layer 602 is an adhesive material such as thermoplastic polyurethane (TPU). In this embodiment, adhesive layer 602 is formed by a solid pellet resin which is dispersed in a solvent and brush, spray, doctor blade or equivalent applied to substrate 204 or a film that can bond one material to another, such as by a thermal lamination process. In still further embodiments, adhesive layer 602 may be made of the same material as adhesive layer 202. In any case, it is important that any material used for adhesive layer 602 be a material which is compatible with microelectronic devices 102A-102F and any electrical connections (e.g. metal interconnections or wiring) formed between microelectronic devices 102A-102F and substrate 204. It is also important that a material for adhesive layer 602 be substantially flexible and/or elastomeric such that it does not significantly impact or reduce a flexibility of the packaging. In some embodiments, adhesive layer 602 may have a thickness of less than 40 micrometers, for example, 30 micrometers or less, or from about 10 micrometers to about 25 micrometers.

In addition to bonding protective layer 702 to substrate 204 as shown in FIG. 6, protective layer 702 should be sealed to the bottom surface 606 of perimeter protective layer 502 as shown in FIG. 7. In one embodiment, protective layer 702 is substantially the same material as protective layer 402 and perimeter protective layer 502. Protective layer 702 may be sealed to perimeter protective layer 502 using ultrasonic welding or thermal welding process to apply heat and pressure to melt and bond the layers together. It is noted, however, that it is important that adhesive layer 602 be confined to an area between protective layer 702 and substrate 204 and not extend into the seal line between protective layer 502 and protective layer 702 when protective layer 502 and protective layer 702 are bonded using a welding process. Rather, protective layer 502 and protective layer 702 are bonded together similar to protective layer 402 and protective layer 502, using, for example, a thermal welding process or a sealant. Once protective layer 702 is sealed to protective layer 502, and in turn, protective layer 402, the layers 702, 502 and 402 in combination form a protective barrier which seals encapsulation module 300. The protective barrier may provide a moisture barrier, diffusion barrier and mechanical barrier around the layers and devices therein.

Although formation of the protective layer is shown in FIG. 4-FIG. 7 as a multi-step process in which multiple layers are applied, it is further contemplated that the protective layer may be formed in any manner and using any material capable of completely sealing the encapsulation module 300 shown in FIG. 3. For example, the encapsulation module 300 may be spin coated or spray coated with a protective material, initially in a liquid form, which is capable of sealing all exposed surfaces of encapsulation module 300.

Figure 8:
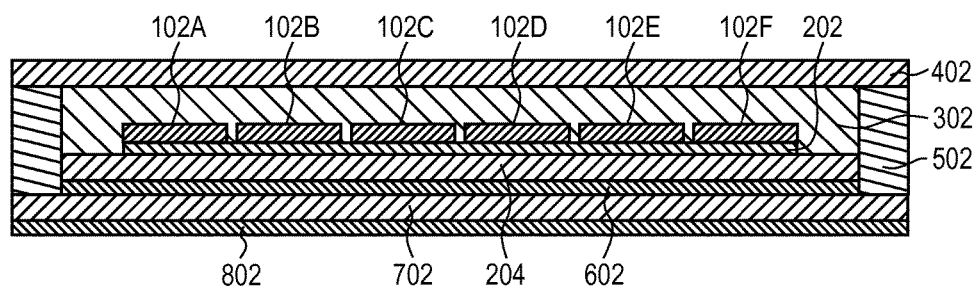
FIG. 8 schematically illustrates a cross-sectional side view of a further adhesive layer formed on the protective layer of the assembly of FIG. 7.
Figure 9:
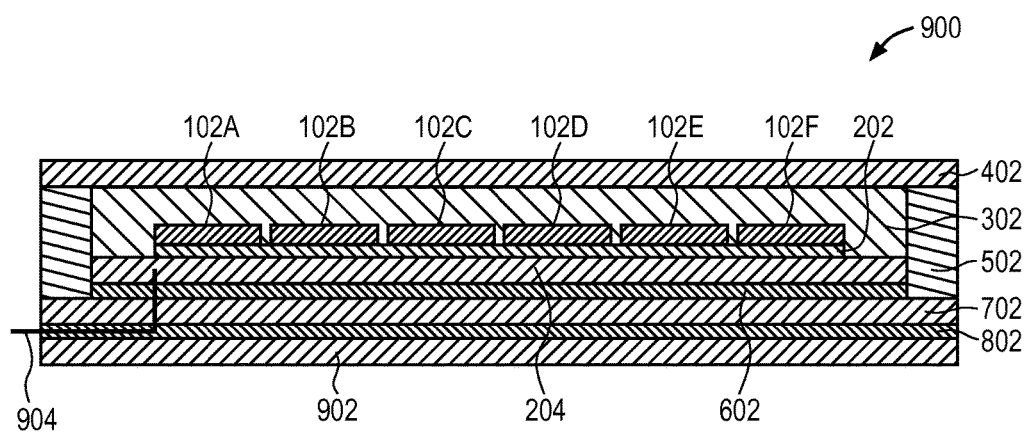
FIG. 9 schematically illustrates a cross-sectional side view of a flexible reinforcing layer connected to the adhesive layer of the assembly of FIG. 8.

FIG. 8 schematically illustrates a cross-sectional side view of a further adhesive layer formed on the protective layer of the assembly of FIG. 7 followed by application of a reinforcing layer in FIG. 9. Once the protective layers 702, 502 and 402 are sealed around encapsulation module 300, a reinforcing layer 902 is bonded to protective layer 702. In one embodiment, reinforcing layer 902 is bonded to protective layer 702 by applying a further adhesive layer 802 between reinforcing layer 902 and protective layer 702. Representatively, in one embodiment, adhesive layer 802 is applied to one or both of protective layer 702 and reinforcing layer 902, then the two layers are bonded using a thermal lamination process. In one embodiment, adhesive layer 802 is made of substantially the same material as adhesive layer 602 and applied to the associated protective layer in a similar manner. For example, in one embodiment, adhesive layer 802 is made of an elastomeric adhesive such as TPU. In this embodiment, adhesive layer 802 is formed by a solid pellet resin which is dispersed in a solvent and brush, spray, doctor blade or equivalent applied to protective layer 702 or a film that can bond one material to another, such as by a thermal lamination process. In any case, it is important that any material used for adhesive layer 802 be a material which is compatible with microelectronic devices 102A-102F and any electrical connections (e.g. metal interconnections or wiring) formed through adhesive layer 802. It is also important that a material for adhesive layer 802 be substantially flexible and/or elastomeric such that it does not significantly impact or reduce a flexibility of the packaging. In some embodiments, adhesive layer 802 may have a thickness of less than 40 micrometers, for example, 30 micrometers or less, or from about 10 micrometers to about 25 micrometers.

Reinforcing layer 902 is coupled to a side of protective layer 702 opposite microelectronic devices 102A-102F. Reinforcing layer 902 may be any type of material layer which provides a mechanical backer to the above discussed device assembly. Representatively, reinforcing layer 902 may be made of a flexible fabric material having a very high modulus and strength. For example, reinforcing layer 902 may be any material that is abrasion and penetration resistant and can reduce a mechanical stress on the rest of the package. For example, in one embodiment, reinforcing layer 902 may be made of a fiber reinforced material including, but not limited to, a Vectran®, polyester, aramid, twaron, Kevlar®, Spectra®, polyethylene, carbon fiber or a glass woven fabric. Other suitable materials may include fire retardant materials, fire retardant treated materials and waterproof materials, including but not limited to, polyesters, nylon, acrylic and other commercial brands such as Marko®, Marlan® and Nomex®.

It is further contemplated, that wiring 904, which provides an electrical connection between microelectronic devices 102A-102F and any assembly within which it may be integrated, may further be provided. For example, wiring 904 may be connected to substrate 204 and extend through protective layer 702 and out the module assembly 900 through a region between protective layer 702 and reinforcing layer 902 as shown. Wiring 904 may, however, extend out of module assembly 900 through other layers or regions of module assembly 900. Regardless of where wiring 904 exits module assembly 900, it is important that wiring 904 also be sealed at any exit ports within and/or between layers so as not to allow moisture transmission to microelectronic devices 102A-102F.

It is further contemplated that in addition to module assembly 900 being a flexible package, it be relatively thin. For example, in some embodiments, an overall thickness of module assembly 900 may be 3 mm or less, for example 500 micrometers or less, for example, less than 400 micrometers, for example, 375 micrometers or less, more specifically, from about 100 micrometers to about 375 micrometers, or from about 200 micrometers to about 300 micrometers.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. For example, although processes for packaging of microelectronic devices such as PV cells are described herein, it is contemplated that the devices need not be limited to such devices. Rather, electronic devices or components of any size which could benefit from a flexible, and in some cases, optically transparent packaging, are contemplated. For example, other types of devices that may be packaged within a flexible packaging using the techniques described herein may include, but are not limited to, DIACs, diodes (rectifier diode), gunn diodes, IMPATT diodes, laser diodes, light-emitting diodes (LED), photocells, PIN diodes, schottky diodes, tunnel diodes, VCSELs, VECSELs, zener diodes, bipolar transistors, darlington transistors, field-effect transistors, insulated-gate bipolar transistor (IGBT)s, silicon controlled rectifiers, thyristors, TRIACs, unijunction transistors, hall effect sensors (magnetic field sensor), integrated circuits (ICs), charge-coupled devices (CCD), microprocessor devices, random-access memory (RAM) devices, or read-only memory (ROM) devices. The description is thus to be regarded as illustrative instead of limiting.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated in the figure to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description, various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. A flexible microsystems enabled microelectronic device package comprising:
    a substrate comprising polyimide, polyethersulfone, or polyether ether ketone;
    a microelectronic device disposed on the substrate and electrically connected to circuitry disposed on the substrate;
    an encapsulation layer encapsulating the microelectronic device and the substrate, wherein the encapsulation layer comprises silicone, polydimethylsiloxane, ethylene vinyl acetate, polyurethane, polyolefin, polyester, nylon, or acrylic;
    a front protective layer positioned over the encapsulating layer on a side of the encapsulating layer opposite to the substrate, a rear protective layer positioned beneath the substrate on a side of the substrate opposite to the encapsulation layer, and a perimeter protective layer positioned around the encapsulating layer; and a reinforcing layer coupled to the rear protective layer, wherein:

the front protective layer, the rear protective layer, and the perimeter protective layer are all made up of substantially the same material and are joined together such that they collectively define an all-around barrier;

the all-around barrier includes a plastic weld joint that seals the front protective layer to the perimeter protective layer and a plastic weld joint that seals the rear protective layer to the perimeter protective layer;

the perimeter protective layer surrounds and abuts the substrate; and the reinforcing layer is coupled to a side of the rear protective layer opposite to the substrate.

2. The device package of claim 1 wherein the microelectronic device is a first photovoltaic solar cell, the device package further comprising a second photovoltaic solar cell.

3. The device package of claim 1 wherein the encapsulating layer is an optically transparent encapsulating layer capable of transmitting light waves to the microelectronic device.

4. The device package of claim 1 wherein the encapsulation layer comprises a silicone material.

5. The device package of claim 1 wherein the all-around barrier comprises a moisture resistant material that protects the microelectronic device from moisture.

6. The device package of claim 1 wherein the all-around barrier comprises a thermoplastic material.

7. The advice package of claim 1 wherein the reinforcing layer comprises a fiber reinforced material that is substantially abrasion and penetration resistant.

8. The device package of claim 1 wherein a thickness of the package is less than 3 millimeters.

9. The device package of claim 1 wherein the all-around barrier has a composition selected from the group consisting of polychorotrifluoroethylene, polytetrafluoroethylene, ethylene chorotrifluoroethylene, ethylene tetrafluoroethylene and polyvinylidene difluoride.

10. The device package of claim 1 wherein the reinforcing layer comprises a material selected from one of Vectran, polyester, aramid, twaron, Kevlar, Spectra, polyethylene, carbon fiber, polyesters, nylon, acrylic Marko, Marlan and Nomex.

11. The device package of claim 1 wherein the perimeter protective layer is separate and distinct from the encapsulation layer.

12. The device package of claim 1 wherein the perimeter protective layer is made up of only one type of material.

13. The device package of claim 1 wherein the perimeter protective layer is deposited separately from the encapsulation layer.

14. The device package of claim 1 wherein the perimeter protective layer includes no portion deposited as the encapsulation layer.

15. The device package of claim 1 wherein the perimeter protective layer includes no portion deposited substantially contemporaneously with the encapsulation layer.

16. The device package of claim 1 wherein the perimeter protective layer is formed around a perimeter of the encapsulation layer which remains exposed after application of the front protective layer.

17. The device package of claim 1 wherein the perimeter protective layer is formed from a film which has a cut out center.

18. The device package of claim 17 wherein the perimeter protective layer is sealed against the front protective layer by one of ultrasonic welding and thermal welding.

19. The device package of claim 1 wherein the perimeter protective layer is one of at least a sealant tape and a sealant bead applied around that is sealed to the front protective layer.

20. The device package of claim 1 wherein the front protective layer, the rear protective layer, and the perimeter protective layer are all made up of one of the group consisting of polychlorotrifluoroethylene (PCTFE), polytetrafluoroethylene (PTFE), ethylene chlorotrifluoroethylene (ECTFE), ethylene tetrafluoroethylene (ETFE), and polyvinylidene difluoride (PVDF).

* * * * *